(12) United States Patent
Hellerer

(10) Patent No.: US 8,811,435 B2
(45) Date of Patent: Aug. 19, 2014

(54) LASER DEVICE FOR PRODUCTION OF A FREQUENCY COMB FREE OF CEO

(75) Inventor: Thomas Hellerer, Munich (DE)

(73) Assignee: TOPTICA Photonics AG, Graefelfing (DE)

( * ) Notice: Subject to any disclaimer, the term of this patent is extended or adjusted under 35 U.S.C. 154(b) by 105 days.

(21) Appl. No.: 13/274,442

(22) Filed: Oct. 17, 2011

(65) Prior Publication Data

US 2012/0093181 A1    Apr. 19, 2012

(30) Foreign Application Priority Data

Oct. 18, 2010    (DE) .......................... 10 2010 048 576

(51) Int. Cl.
*H01S 3/109*    (2006.01)
*H01S 3/00*    (2006.01)
*H01S 5/00*    (2006.01)

(52) U.S. Cl.
CPC ............. *H01S 3/0092* (2013.01); *H01S 5/0092* (2013.01)
USPC ............. 372/22; 372/21; 372/29.023; 372/23

(58) Field of Classification Search
CPC .............................. H01S 5/0092; H01S 3/0092
USPC .................................... 372/21, 22, 29.023, 23
See application file for complete search history.

(56) References Cited

U.S. PATENT DOCUMENTS

| 6,724,788 | B1 * | 4/2004 | Holzwarth et al. | ............. 372/32 |
| 6,785,303 | B1 * | 8/2004 | Holzwarth et al. | ............. 372/16 |
| 2004/0017833 | A1 * | 1/2004 | Cundiff et al. | ................... 372/18 |
| 2008/0069159 | A1 * | 3/2008 | Adel et al. | ....................... 372/32 |

FOREIGN PATENT DOCUMENTS

DE    10 2004 022 037    12/2005

* cited by examiner

*Primary Examiner* — Julio J Maldonado
*Assistant Examiner* — Joshua King
(74) *Attorney, Agent, or Firm* — Collard & Roe, P.C.

(57) ABSTRACT

The invention relates to a laser device, comprising a radiation source (1) that emits radiation having a spectrum in the form of a frequency comb having a plurality of equidistant spectral lines, and a difference frequency generator (5) that converts the radiation in such a manner that the spectrum of the converted radiation once again has the form of a frequency comb, whereby the frequencies of the spectral lines in the spectrum of the converted radiation are harmonics of a base frequency. The invention proposes that a frequency multiplier (6) follows the difference frequency generator (5) in the course of the radiation.

12 Claims, 2 Drawing Sheets

LASER DEVICE FOR PRODUCTION OF A FREQUENCY COMB FREE OF CEO

CROSS REFERENCE TO RELATED APPLICATIONS

Applicant claims priority under 35 U.S.C. §119 of German Application No. 10 2010 048 576.4 filed on Oct. 18, 2010, the disclosure of which is incorporated by reference.

BACKGROUND OF THE INVENTION

The invention relates to a laser device, comprising a radiation source that emits radiation having a spectrum in the form of a frequency comb having a plurality of equidistant spectral lines, and a difference frequency generator that converts the radiation in such a manner that the spectrum of the converted radiation once again has the form of a frequency comb, whereby the frequencies of the spectral lines in the spectrum of the converted radiation are harmonics of a base frequency.

Optical frequency combs have been receiving particularly great attention for the past few years. At the beginning, the main concern was applications of the optical frequency combs in precision spectroscopy. In the meantime, applications in the sector of frequency metrology are also of great interest.

Ultra-short optical pulses in the picosecond and femtosecond range can be produced using mode-coupled lasers. The frequency spectrum of a regular pulse sequence, such as that emitted by a mode-coupled laser, consists of equidistant discrete spectral lines. Such a frequency spectrum is called a frequency comb. The individual spectral lines are very narrow in comparison with their spacing in the spectrum. In this connection, their spacing corresponds to the repetition rate of the pulses, which typically lies in the range between 10 MHz and 10 GHz. Pulse distances between 100 ns and 100 ps correspond to this. The entire spectrum can be many THz in width. In the case of such frequency combs generated by means of mode-coupled lasers, however, it is not the case that the absolute frequencies of all the spectral lines are whole-number multiples, i.e. harmonics of a base frequency. This results from the fact that the electrical carrier field of the radiation experiences a change in phase from pulse to pulse with regard to the envelope of the pulse. This situation is generally referred to with the term CEO phase slip or also, in short form, Carrier Envelope Offset (CEO). The CEO phase slip results from the phase and group velocities of the laser pulse that circulates in the laser resonator, which velocities deviate from one another, and depends on various dispersive and non-linear effects in the laser. Because of the CEO phase slip, the entire spectrum is shifted by a corresponding CEO frequency as compared with the frequency origin. The frequencies of the individual spectral lines of the frequency comb therefore result as a sum of the CEO frequency and a whole-number multiple of the repetition rate of the laser. The CEO frequency is very important in metrology, because the absolute frequencies $f_n$ of all the spectral lines are only clearly determined by the indication of the whole-number multiple n of the repetition rate df and of the CEO frequency $f_{CEO}$.

$$f_n = f_{CEO} + n*df$$

A laser device of the type stated initially is known from DE 10 2004 022 037 A1, in which device a difference frequency generator is used to generate an optical frequency comb free of CEO. This difference frequency generator converts the radiation of a mode-coupled laser in such a manner that spectral lines are generated, the frequency of which is equal, in each instance, to the difference frequency of two spectral lines of the radiation (which might already have been widened) of the mode-coupled laser. The CEO frequency is eliminated by means of the difference formation, i.e. $f_{CEO}=0$. The result is a frequency comb free of CEO, in which the frequencies of the spectral lines are clearly defined solely by means of a whole-number multiple of the repetition rate of the mode-coupled laser, because the CEO frequency assumes the value of zero:

$$f_n = n*df$$

The radiation converted by means of difference frequency generation therefore once again has the form of a frequency comb, whereby the frequencies of the spectral lines in the spectrum of the converted radiation are harmonics of the base frequency.

In the case of the known laser device, it is decisively important that the spectral lines of the radiation of the mode-coupled laser, which lines are subjected to difference frequency generation, have a frequency spacing that corresponds to at least one octave. Actually, a frequency spacing of two octaves is preferred. This is a prerequisite for having the spectrum of the radiation lie approximately in the spectral range of the amplification of the mode-coupled laser once again after difference frequency generation. In the case of the known laser device, it is therefore necessary to first generate a frequency comb that spans more than one octave by means of the mode-coupled laser. Such a spectrum is also called an optical continuum. It is disadvantageous that generation of a continuum that spans more than one octave requires a relatively complicated structure of the previously known laser device. Furthermore, important radiation properties of the frequency comb, such as noise, coherence, etc. are negatively influenced with an increasing widening of the continuum.

SUMMARY OF THE INVENTION

Against this background, it is the task of the invention to make available a laser device that is simplified as compared with the state of the art, which device is able to generate a frequency comb free of CEO, specifically with an improved quality as compared with the state of the art, if at all possible.

This task is accomplished by the invention, proceeding from a laser device of the type indicated initially, in that a frequency multiplier follows the difference frequency generator in the course of the radiation.

In the case of the laser device according to the invention, the width of the spectrum before difference frequency generation can be clearly less than one octave. However, this leads to the result that the frequencies of the spectral lines after difference frequency generation clearly lie outside of the frequency range of the original radiation. The radiation after difference frequency generation can be shifted into the frequency range of the amplification of the radiation source by means of the frequency multiplier that follows the difference frequency generator, according to the invention. The result is an optical frequency comb free of CEO, at the wavelength of the radiation source. The complicated generation of a continuum that spans more than one octave can be eliminated in the case of the laser device according to the invention. In the case of the laser device according to the invention, it is sufficient, for example, if the frequency range of the radiation of the radiation source spans only one-third of an octave. Accordingly, the laser device according to the invention is less complicated and can therefore be produced more cost-advantageously.

Because of the low demands on the spectral width of the frequency comb before difference frequency generation, the laser device according to the invention has other advantages. Thus, the laser device according to the invention is less susceptible to spectral coherence losses and noise, for example, than the laser device known from the state of the art.

In a preferred embodiment of the device according to the invention, the frequency range of the radiation at the output of the frequency multiplier overlaps with the amplification range of the radiation source, at least in part. This means nothing different, as explained above, than that the spectral lines after difference frequency generation and frequency multiplication once again lie in the frequency range of the original radiation of the radiation source. Likewise, it is possible that the spectral lines of the radiation generated according to the invention fall into the amplification range of another radiation source and are re-amplified by the latter.

According to a preferred embodiment, the laser device according to the invention comprises a mode-coupled laser as the radiation source. Mode-coupled lasers, as has been mentioned above, are able to generate ultra-short optical pulses in the picosecond and femtosecond range, in the form of a highly regular pulse sequence. This is a compulsory prerequisite for generating a frequency comb.

It is practical if the mode-coupled laser (oscillator) generates a sufficiently high peak intensity of the radiation. This can also be achieved by means of an optical amplifier that follows the oscillator. The widening of the spectrum that might be necessary (see below), the difference frequency generation, and the frequency multiplication take place, in the laser device according to the invention, making use of non-linear optical processes. Their efficiency depends, above all, on the intensity of the radiation. In order to achieve sufficient efficiency, the radiation should therefore have a sufficient peak intensity before the spectral widening, difference frequency generation, and frequency multiplication that might be necessary.

According to another preferred embodiment, the radiation source of the laser device according to the invention comprises a means that follows the oscillator or the optical amplifier, for increasing the spectral width of the radiation. An optical non-linear element can be used, for example, to increase the spectral width. The use of an optically highly non-linear and/or micro-structured fiber is a possibility. These are means conventionally used for continuum generation. In contrast to the state of the art, however, the invention makes clearly lower demands on the spectral width of the continuum, as has been explained above. A certain spectral width, for example of half an octave or less, is still required, however, so that the frequencies of the spectral lines after difference frequency generation lie in a frequency range that can continue to be handled. In particular, the frequency multiplication that is provided according to the invention must be possible.

In the laser device according to the invention, generation of one of the spectral components necessary for difference frequency formation can take place by means of induced Raman scattering. Raman scattering brings about a spectral shift exclusively toward lower frequencies. A simple glass fiber, for example, through which the radiation propagates, can be used to generate a spectral shift by means of Raman scattering. In this case, the stated effect is also known under the term solution self-frequency shift (SSFS). A significant advantage is the greater intensity of the radiation shifted by means of Raman scattering. This has a positive effect on the efficiency of the subsequent optical non-linear processes.

In the laser device according to the invention, the spectral width of the radiation emitted by the radiation source should amount to maximally one octave, in any case. Preferably, the spectral width amounts to less than two-thirds of an octave.

Depending on the application case, a second optical amplifier can follow the frequency multiplier of the device according to the invention. Because the frequency of the spectral lines of the frequency comb preferably lie in the amplification range of the original radiation source again after difference frequency generation and frequency multiplication according to the invention, the same amplifier medium that is also used in the radiation source can advantageously be used in the second optical amplifier. Likewise, it is possible that an amplifier having a red-shifted amplification range as compared with the radiation source is used in the re-amplification.

In a preferred embodiment of the laser device according to the invention, a compensation element for temporal equalization of the spectral components precedes the difference frequency generator. The compensation element, which can be a delay segment or a so-called dispersion-compensating fiber (DCF), for example, ensures temporal superimposition of the modes of the frequency comb contained in the radiation source, in the difference frequency generator. Only in the case of corresponding temporal and spatial superimposition of the pulses emitted into the difference frequency generator is difference frequency generation possible at all.

In a practical implementation of the laser device according to the invention, it should be ensured that the spectral components of the original frequency comb, i.e. the frequency comb containing the CEO frequency, are eliminated from the course of the radiation, before the newly generated frequency comb, i.e. the frequency comb free of CEO, is made available or optically amplified. This can be brought about by means of a suitable filter device, which blocks the original radiation by means of reflection or absorption, or removes it spatially from the course of the radiation, by means of refraction, diffraction, or on the basis of the polarization state. Preferably, the filter device is inserted between difference frequency generator and frequency multiplier. However, it can also be inserted already ahead of the difference frequency generation, if the spectral components required for this are sufficiently spectrally removed from the frequency comb free of CEO that is generated later. The filter device can be eliminated if the amplification range of the subsequent amplifier is sufficiently spectrally removed from the frequency comb that contains CEO, and this comb is therefore not optically re-amplified.

In a practical implementation of the laser device according to the invention, the difference frequency generator and the frequency multiplier can comprise optically non-linear elements such as crystals of lithium borate (LBO) or barium borate (BBO) or periodically poled crystals of lithium niobate (ppLN) or lithium tantalite (ppSLT), for example. The periodically poled crystals allow quasi-phase adaptation both in difference frequency generation and in frequency multiplication, with particularly great non-linear coefficients. A variant in which the difference frequency generator, the filter device, if applicable, and the frequency multiplier are formed by an individually, periodically poled crystal, which has regions with different poling periods disposed one behind the other in the radiation direction, is particularly preferred. This allows a particularly compact and robust structure. Furthermore, a waveguide structure written into the crystal is advantageous for increasing the efficiency of the non-linear processes.

BRIEF DESCRIPTION OF THE DRAWINGS

Exemplary embodiments of the invention will be explained in greater detail below, using the drawings. These show.

DETAILED DESCRIPTION OF THE EMBODIMENTS

Figure 1:
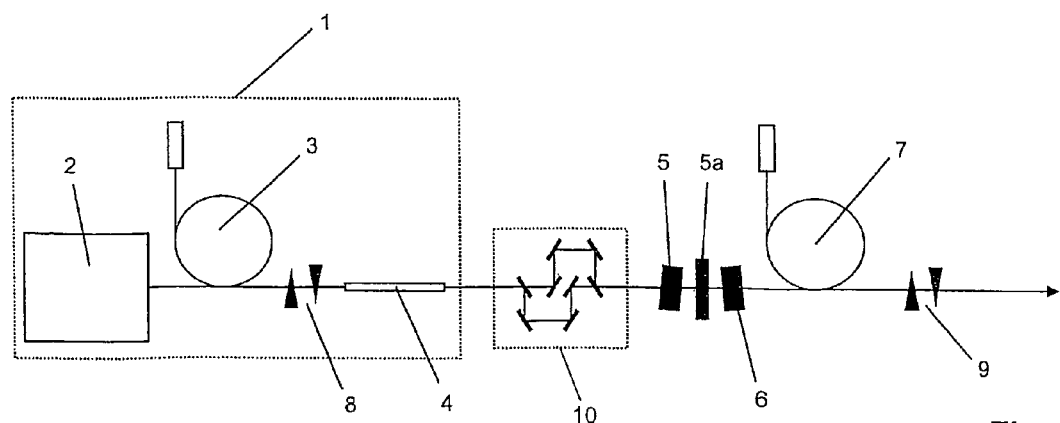
FIG. 1: schematic representation of an exemplary embodiment of a laser device according to the invention.

The laser device shown in FIG. 1 has a radiation source 1 that emits radiation having a spectrum in the form of a frequency comb having a plurality of equidistant spectral lines. The radiation source 1 comprises a mode-coupled erbium fiber laser as an oscillator 2. The latter emits ultra-short optical pulses at a wavelength of 1.5 µm. The pulses emitted by the mode-coupled oscillator 2 are amplified by means of a first optical amplifier 3. This is a diode-pumped fiber amplifier. The amplified radiation is coupled into an optically highly non-linear fiber 4, which serves to increase the spectral width of the radiation. A continuum at a wavelength of 1.0 µm is generated by means of the highly non-linear fiber 4. The continuum is passed to a difference frequency generator 5, together with the (amplified) fundamental radiation of the mode-coupled laser 2. This generator is a suitable non-linear crystal. The spectrum at the output of the difference frequency generator 5 has spectral lines whose frequencies are equal to the differences of the frequencies of the spectral lines contained in the continuum and the frequency of the fundamental radiation of the mode-coupled laser 2. Thus, a frequency comb at a wavelength of 3 µm is generated by means of the difference frequency generator 5. A spectral or polarization filter 5a removes the remaining radiation of the radiation source from the course of the radiation. In the exemplary embodiment shown, frequency doubling takes place by means of a frequency multiplier 6. The frequency multiplier 6, once again, is a non-linear crystal. After frequency doubling by means of the frequency multiplier 6, a spectrum in the form of a frequency comb free of CEO is present at the fundamental wavelength of the mode-coupled laser 2, i.e. at 1.5 µm. Final amplification takes place by means of a second optical amplifier 7. The laser device comprises prism pairs 8 and 9 for dispersion control. The difference frequency generator 5 is preceded by a compensation element 10 having delay segments. The compensation element 10 serves to increase the efficiency of the non-linear optical processes, in that it brings about temporal superimposition of the modes contained in the radiation of the radiation source 1, in the difference frequency generator 5.

Figure 2:
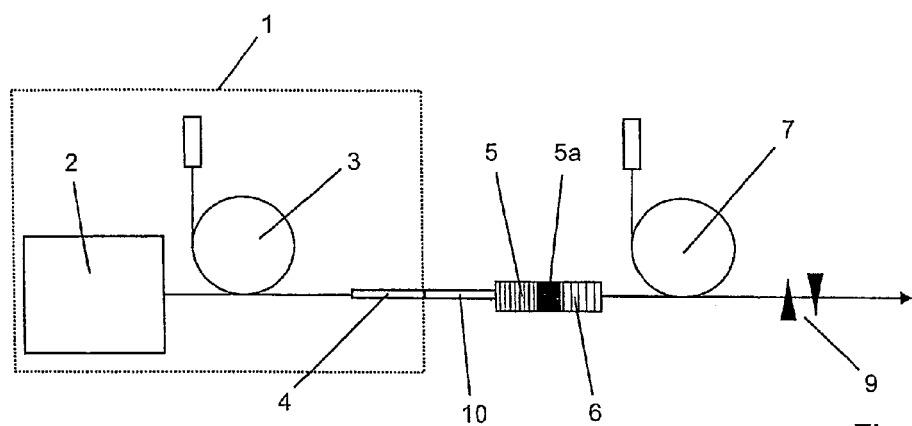
FIG. 2: schematic representation of an alternative exemplary embodiment.

In the exemplary embodiment shown in FIG. 2, the difference frequency generator 5 and the frequency multiplier 6 are configured as a periodically poled crystal that has regions disposed one behind the other in the radiation direction, with correspondingly different poling periods for difference frequency generation and frequency multiplication, respectively. The difference frequency generator 5 is preceded by a dispersion-compensating fiber having the function described above, with reference to FIG. 1, as a compensation element 10.

A segment 5a having poling periods is configured between difference frequency generator 5 and frequency multiplier 6, in such a manner that it serves as a Bragg reflector for the radiation of the radiation source, and effectively blocks the latter for the further course of the radiation. In contrast, the difference frequency that is generated is transmitted by the segment 5a.

Figure 3:
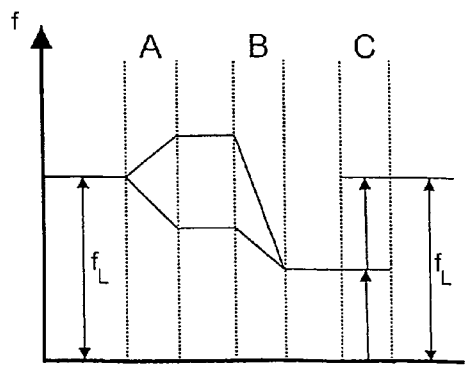
FIG. 3: illustration of the principle according to the invention, with difference frequency generation and frequency multiplication, using a diagram.

FIG. 3 illustrates the method of procedure for generation of a frequency comb free of CEO, according to the invention. The starting point is the radiation of the radiation source 1, which emits ultra-short pulses at the frequency $f_L$. The continuum generation described above takes place in the step referred to as A. This means that the spectral width of the radiation of the radiation source 1 is increased, for example by means of the highly non-linear fiber 4 (see FIG. 1). For example, generation of a two-part continuum takes place proceeding from the radiation of the mode-coupled erbium fiber laser that emits at a wavelength of 1.5 µm, by means of the highly non-linear fiber 4. In this connection, part of the spectrum is blue-shifted, and the other part is red-shifted. In the diagram of FIG. 3, the frequencies of the two spectral lines that are generated in step A are shown as examples. The wavelengths can lie at 1.2 µm (blue-shifted) and 2.0 µm (red-shifted), for example. This corresponds to frequencies of 250 THz and 150 THz. The fundamental frequency $f_L$ of the radiation of the radiation source 1 lies at 200 THz. Difference frequency generation takes place in step B. The difference frequency amounts to 100 THz in the exemplary embodiment shown. Frequency doubling to 200 THz takes place in step C; this again corresponds to the fundamental frequency $f_L$ of the radiation source 1. As can be seen in the diagram of FIG. 3, the continuum generated in step A spans a frequency range that is clearly less than an octave.

Figure 4:
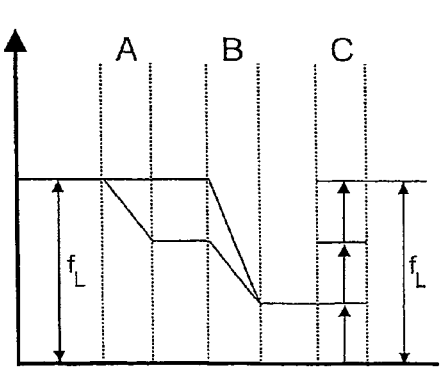
FIG. 4: alternative method of procedure in the case of difference frequency generation and frequency multiplication according to the invention.

In the exemplary embodiment shown in FIG. 4, spectral widening in step A takes place by means of Raman scattering. Therefore, only a red shift takes place here. The wavelengths of the spectral lines shown in the diagram of FIG. 4 lie at 1.5 µm and 2.25 µm after the spectral widening in step A. This corresponds to frequencies of 200 THz and 133 THz. After difference frequency generation in step B, the frequency lies at 66 THz, accordingly (4.5 µm). One arrives back at the original frequency $f_L$ (1.5 µm or 200 THz) by means of frequency tripling in step C.

On the one hand, the efficiency of the frequency multiplication decreases greatly at higher harmonics. On the other hand, the demands on the spectral width of the radiation source 1 and the continuum generation, respectively, decrease at higher harmonics. Therefore the optimum should be aimed at in practical implementation, at which the demands on the radiation source 1 are balanced out against the efficiency of the frequency multiplication, and the total effort is minimized in this connection.

Figure 5:
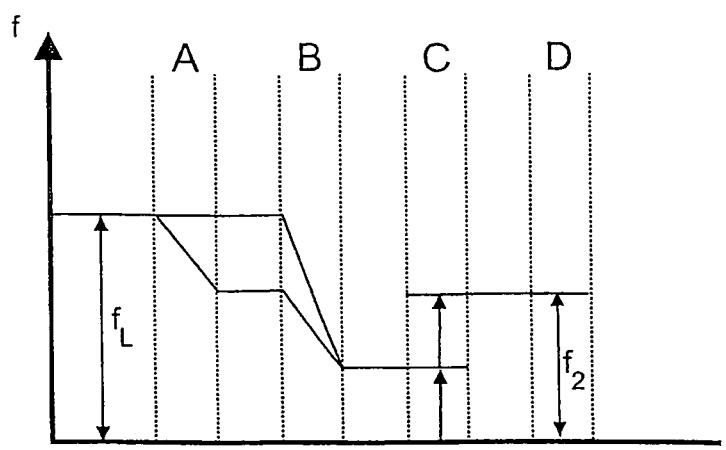
FIG. 5: modification of the principle according to the invention, with difference frequency generation, frequency multiplication, and re-amplification.

The schematic shown in FIG. 5 corresponds, in method steps A and B, fundamentally to that of FIG. 4, with the difference that the wavelength of the radiation source amounts to only about 1 µm (frequency $f_L$). For this purpose, the radiation source is based on Yb-doped fibers, for example. The continuum generated in step A has a width of about a third of an octave, leading to a difference frequency corresponding to a wavelength of 3 µm after step B. This is now not frequency-tripled in step C, but rather only frequency-doubled, so that the wavelength afterwards amounts to 1.5 µm (frequency $f_2$). This radiation can then be amplified in step D, for example by means of an Er-doped fiber. This is because the frequency comb free of CEO lies in the amplification range of an Er-fiber amplifier after frequency doubling.

The invention claimed is:

1. Laser device, comprising a radiation source (1) that emits radiation having a spectrum in the form of a frequency comb having a plurality of equidistant spectral lines, and a difference frequency generator (5) that converts the radiation in such a manner that the spectrum of the converted radiation once again has the form of a frequency comb, whereby the frequencies of the spectral lines in the spectrum of the converted radiation are harmonics of a base frequency, comprising a frequency multiplier (6) that follows the difference frequency generator (5) in the course of the radiation, wherein the frequency range of the radiation at the output of the frequency multiplier at least partly overlaps with the frequency range of the radiation of the radiation source, and wherein the spectral width of the radiation emitted by the radiation source amounts to maximally two-thirds of an octave.

2. Device according to claim 1, wherein the radiation source (1) comprises a mode-coupled laser (2).

3. Device according to claim 2, wherein the mode-coupled laser (2) is followed by a first optical amplifier (3).

4. Device according to claim 2, wherein the radiation source (1) comprises a means for increasing the spectral width of the radiation, which means follows the mode-coupled laser (2) or the optical amplifier (3).

5. Device according to claim 4, wherein the means for increasing the spectral width comprises an element (4) having optical non-linearity.

6. Device according to claim 4, wherein the increase in spectral width takes place by means of Raman scattering.

7. Device according to claim 1, further comprising a second optical amplifier (7) that follows the frequency multiplier (6).

8. Device according to claim 1, wherein the difference frequency generator (5) is preceded by a compensation element (10) that brings about temporal superimposition of the modes contained in the radiation of the radiation source (1), in the difference frequency generator (5).

9. Device according to claim 1, wherein the difference frequency generator (5) and the frequency multiplier (6) comprise periodically poled crystals.

10. Device according to claim 1, wherein the difference frequency generator (5) and the frequency multiplier (6) are formed by a single periodically poled crystal, which has regions having different poling periods, disposed one behind the other in the radiation direction.

11. Device according to claim 1, further comprising a filter device (5a) that eliminates the spectral components of the radiation of the radiation source (1) from the course of the radiation, and allows at least a part of the converted radiation to pass through.

12. Device according to claim 11, wherein the filter device (5a) is inserted into the course of the radiation between difference frequency generator (5) and frequency multiplier (6).

* * * * *